(12) United States Patent
Ahn et al.

(10) Patent No.: US 8,420,513 B2
(45) Date of Patent: Apr. 16, 2013

(54) METHOD OF FABRICATING THIN FILM TRANSISTOR

(75) Inventors: Ji-Su Ahn, Yongin (KR); Eui-Hoon Hwang, Yongin (KR); Cheol-Ho Yu, Yongin (KR); Kwang-Nam Kim, Yongin (KR); Sung-Chul Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/419,757

(22) Filed: Mar. 14, 2012

(65) Prior Publication Data

US 2012/0171823 A1 Jul. 5, 2012

Related U.S. Application Data

(62) Division of application No. 12/458,126, filed on Jul. 1, 2009, now Pat. No. 8,158,984.

(30) Foreign Application Priority Data

Jul. 2, 2008 (KR) ........................ 10-2008-0064000

(51) Int. Cl.
*H01L 29/04* (2006.01)
*H01L 21/20* (2006.01)

(52) U.S. Cl.
USPC ........... 438/486; 438/149; 438/166; 438/482; 257/49; 257/66; 257/E29.273

(58) Field of Classification Search ............... 257/49, 257/66, 72, E29, 273, E27.116; 438/96, 438/98, 149, 166, 479, 482, 486
See application file for complete search history.

(56) References Cited

U.S. PATENT DOCUMENTS

| 6,989,298 B2 | 1/2006 | Chen et al. |
| 7,202,501 B2 | 4/2007 | Kim et al. |
| 2007/0052022 A1 | 3/2007 | Park et al. |

FOREIGN PATENT DOCUMENTS

| KR | 10-0163912 B1 | 9/1998 |
| KR | 10-2002-0031835 A | 5/2002 |
| KR | 10-2005-0049684 A | 5/2005 |
| KR | 10-2006-0055621 A | 5/2006 |
| KR | 10-2007-0024142 A | 3/2007 |
| KR | 10-2007-0066893 A | 6/2007 |
| KR | 10-2009-0115474 A | 11/2009 |

*Primary Examiner* — Matthew E Warren
(74) *Attorney, Agent, or Firm* — Lee & Morse, P.C.

(57) ABSTRACT

A thin film transistor (TFT), including a crystalline semiconductor pattern on a substrate, a gate insulating layer on the crystalline semiconductor pattern, the gate insulating layer having two first source/drain contact holes and a semiconductor pattern access hole therein, a gate electrode on the gate insulating layer, the gate electrode being between the two first source/drain contact holes, an interlayer insulating layer covering the gate electrode, the interlayer insulating layer having two second source/drain contact holes therein, and source and drain electrodes on the interlayer insulating layer, each of the source and drain electrodes being insulated from the gate electrode, and having a portion connected to the crystalline semiconductor pattern through the first and second source/drain contact holes.

19 Claims, 3 Drawing Sheets

METHOD OF FABRICATING THIN FILM TRANSISTOR

CROSS REFERENCE TO RELATED APPLICATION

This is a divisional application based on application Ser. No. 12/458,126, filed Jul. 1, 2009 now U.S. Pat. No. 8,158,984, the entire contents of which is hereby incorporated by reference.

BACKGROUND OF THE INVENTION

1. Field of the Invention

Embodiments relate to a thin film transistor, a method of fabricating the same, and an organic light emitting diode display device including the same. More particularly, embodiments relate to a thin film transistor (TFT) that can prevent generated Joule heat from generating an arc during a conventional crystallization process.

2. Description of the Related Art

Annealing methods used during a crystallization process generally include a furnace annealing method using a heat furnace, a rapid thermal annealing (RTA) method using radiant heat, e.g., a halogen lamp, a laser annealing method using a laser, and an annealing method using Joule heating. Among available annealing methods, an appropriate annealing method for the crystallization process is determined based on characteristics of material and process contemplated. Some of the factors to be considered in the selection of an appropriate annealing method are a range of an annealing temperature, uniformity of the annealing temperature, a heating rate, a cooling rate, purchase price, and maintenance cost. However, a selection of annealing method becomes very limited when high temperature annealing or high rate annealing only in a local region of a material is needed.

The laser annealing method can rapidly anneal a surface of a material. Despite this advantage, the laser annealing method has only limited applicability, since it can only be used to anneal particular materials. When scanned linear laser beams overlap to anneal a large-sized device, non-uniformity in intensity of the laser beam and in irradiation level of the laser beam may occur. Also, the laser annealing method requires very expensive equipment, as well as incurring high maintenance cost.

The RTA method is widely applied to a semiconductor fabrication process. However, with current technology, RTA methods can be applied only to a 300 mm silicon wafer, so it is difficult to uniformly anneal a substrate larger than 300 mm. Moreover, this method has a maximum heating rate of about 400° C./sec, and thus cannot be applied to a process requiring a higher heating rate than 400° C./sec. Thus, research has been widely conducted on annealing methods to solve these problems and to eliminate processing limitations.

SUMMARY OF THE INVENTION

Embodiments are therefore directed to a TFT, a method of fabricating the same, and an organic light emitting diode (OLED) display device using the same, which substantially overcome one or more of the disadvantages of the related art.

It is therefore a feature of an embodiment to provide a TFT having a semiconductor layer crystallized by application of an electrical field capable of preventing an arc formation during the crystallization of an amorphous layer, as the result of heat transfer from the metal layer.

It is therefore another feature of an embodiment to provide a method of fabricating a TFT exhibiting above features and OLED display device including the TFT.

At least one of the above features and other advantages may be realized by providing a thin film transistor (TFT), including a crystalline semiconductor pattern on a substrate, a gate insulating layer on the crystalline semiconductor pattern, the gate insulating layer having two first source/drain contact holes and a semiconductor pattern access hole therein, a gate electrode on the gate insulating layer, the gate electrode being between the two first source/drain contact holes, an interlayer insulating layer covering the gate electrode, the interlayer insulating layer having two second source/drain contact holes therein, and source and drain electrodes on the interlayer insulating layer, each of the source and drain electrodes being insulated from the gate electrode, and having a portion connected to the crystalline semiconductor pattern through the first and second source/drain contact holes.

The semiconductor pattern access hole may be spaced apart from the first source/drain contact holes, the semiconductor pattern access hole may be at an upper region of the semiconductor pattern, and the semiconductor pattern access hole may correspond to a region other than a channel region of the semiconductor pattern.

The semiconductor pattern access hole may partially expose the crystalline semiconductor pattern.

The exposed crystalline semiconductor pattern may be in contact with the interlayer insulating layer through the semiconductor pattern access hole.

The gate electrode may have a thickness of about 50 nm to about 200 nm.

The gate electrode may be formed of aluminum, chromium, molybdenum, or a combination thereof.

The gate insulating layer may include two or more semiconductor pattern access holes therein.

The TFT may further include a buffer layer between the substrate and the crystalline semiconductor pattern.

At least one of the above features and other advantages may also be realized by providing a method of fabricating a thin film transistor, the method including forming an amorphous semiconductor layer on a substrate, patterning the amorphous semiconductor layer to form an amorphous semiconductor pattern, forming a gate insulating layer on the amorphous semiconductor pattern, forming a semiconductor pattern access hole in the gate insulating layer, forming a metal layer on the substrate, the metal layer covering the gate insulating layer, and being in the semiconductor pattern access hole so as to be in contact therethrough with the amorphous semiconductor pattern, passing an electric current through the metal layer so as to convert the amorphous semiconductor pattern to a crystallized semiconductor pattern using heat generated by the electric current, patterning the metal layer to form a gate electrode corresponding to the crystallized semiconductor pattern, forming an interlayer insulating layer on the gate electrode, forming two first source/drain contact holes in the gate insulating layer and two source/drain contact holes in the interlayer insulating layer, and forming source and drain electrodes connected to the semiconductor layer through the first and second source/drain contact holes.

The crystallization may be performed while the metal layer is in contact with the amorphous semiconductor pattern through the semiconductor pattern access hole.

The electric current may be generated by applying an electrical field of about 100 V/cm$^2$ to about 10,000 V/cm$^2$ to the metal layer.

The gate electrode may be formed to a thickness of about 50 nm to about 200 nm.

The semiconductor pattern access hole may be spaced apart from the first source/drain contact holes.

The semiconductor pattern access hole may be formed to correspond to a region other than a channel region of the crystallized semiconductor pattern.

The method may further include forming a buffer layer on the substrate before forming the amorphous semiconductor layer, such that the buffer layer is between the amorphous semiconductor layer and the substrate.

At least one of the above features and other advantages may also be realized by providing an organic light emitting diode (OLED) display device, including OLEDs configured to emit light, and thin film transistors (TFTs) coupled to the OLEDs, each TFT including a crystalline semiconductor pattern on a substrate, a gate insulating layer on the crystalline semiconductor pattern, the gate insulating layer having two first source/drain contact holes and a semiconductor pattern access hole therein, a gate electrode on the gate insulating layer, the gate electrode being between the two first source/drain contact holes, an interlayer insulating layer covering the gate electrode, the interlayer insulating layer having two second source/drain contact holes therein, and source and drain electrodes on the interlayer insulating layer, each of the source and drain electrodes being insulated from the gate electrode, and having a portion connected to the crystalline semiconductor pattern through the first and second source/drain contact holes.

The semiconductor pattern access hole may be spaced apart from the first source/drain contact holes, the semiconductor pattern access hole may be at an upper region of the semiconductor pattern, and the semiconductor pattern access hole may correspond to a region other than a channel region of the semiconductor pattern.

The semiconductor pattern access hole may partially expose the crystalline semiconductor pattern.

The exposed crystalline semiconductor pattern may be in contact with the interlayer insulating layer through the semiconductor pattern access hole.

The gate electrode may have a thickness of about 50 nm to about 200 nm.

The gate electrode may be formed of aluminum, chromium, molybdenum, or a combination thereof.

The gate insulating layer may include two or more semiconductor pattern access holes therein.

The OLED display device may further include a buffer layer between the substrate and the crystalline semiconductor pattern.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1A:
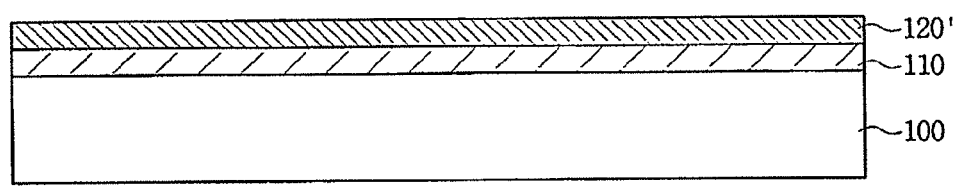
FIGS. 1A to 1D illustrate cross-sectional views of stages in a method of making a TFT according to a first example embodiment.

Korean Patent Application No. 10-2008-0064000, filed on Jul. 2, 2008, in the Korean Intellectual Property Office, and entitled: "Thin Film Transistor, Method of Fabricating the Same, and Organic Light Emitting Diode Display Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

FIGS. 1A to 1D illustrate cross-sectional views of stages in a method of making a TFT according to a first example embodiment.

Referring to FIG. 1A, a substrate 100 is provided. The substrate 100 may be formed of, e.g., a transparent material such as glass or plastic. A buffer layer 110 may be on the substrate 100. The buffer layer 110 may prevent or reduce out-diffusion of moisture or impurities from the substrate 100, and/or may control a heat transfer rate during crystallization to facilitate the crystallization of an amorphous semiconductor layer. The buffer layer 110 may be, e.g., a silicon oxide layer, a silicon nitride layer, or a combination thereof.

Subsequently, an amorphous semiconductor layer 120', e.g., amorphous silicon, may be formed on the substrate 100. As described in additional detail below, the amorphous semiconductor layer 120' may be patterned, after which it may be crystallized to form a crystalline semiconductor pattern 120.

Figure 1B:
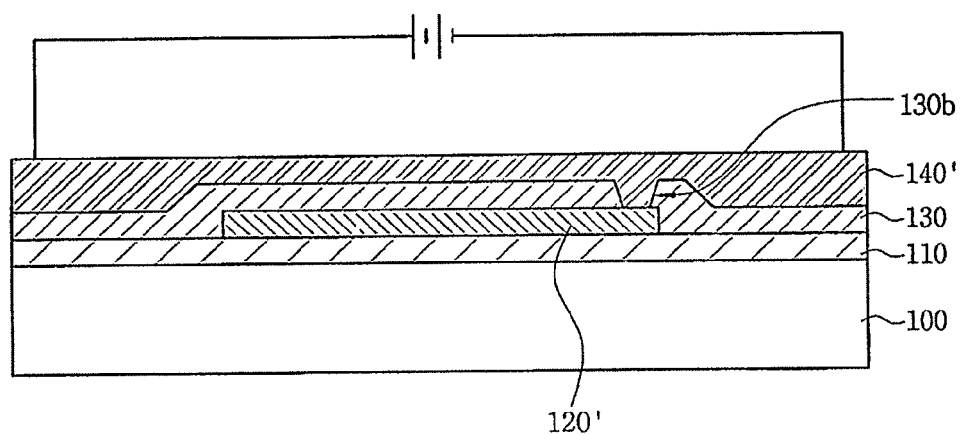

Referring to FIG. 1B, a gate insulating layer 130 may be on the entire surface of the substrate 100 including the amorphous semiconductor pattern 120'. The gate insulating layer 130 may be, e.g., a silicon oxide layer, a silicon nitride layer, or a combination thereof.

A semiconductor pattern access hole 130b may be formed in the gate insulating layer 130 to partially expose the amorphous semiconductor pattern 120'. The semiconductor pattern access hole 130b may be disposed on the amorphous semiconductor pattern 120' to correspond to a non-channel region outside a channel region 120c of a resultant crystalline semiconductor pattern 120 (shown in FIG. 1D). In an implementation (not shown), the semiconductor pattern access hole 130*b* may be formed using a same mask used to forming source and drain electrodes later.

Subsequently, a metal layer 140' may be formed on the entire surface of the substrate 100. The semiconductor pattern access hole 130*b* may be filled with the metal layer 140', thus enabling a direct contact between the metal layer 140' and the amorphous semiconductor pattern 120'.

The metal layer 140' may be a single layer, e.g., aluminum (Al) or an Al alloy, e.g., aluminum-neodymium (Al—Nd), or a multi layer formed by stacking, e.g., an aluminum (Al) alloy on a chromium (Cr) or molybdenum (Mo) alloy. The metal layer 140' may be generally formed to a thickness suitable for a gate electrode 140, e.g., about 50 nm to about 200 nm. When the thickness is less than about 50 nm, the metal layer 140' may not be uniformly formed. As the result, heat may not be uniformly transferred to the amorphous semiconductor layer pattern 120', resulting in non-uniform crystallization. The gate electrode 140 may suitably operate as an electrode suitable for thin film device when it is formed by patterning the metal layer 140' having a thickness of about 200 nm or less, but greater than about 50 nm.

Figure 1C:
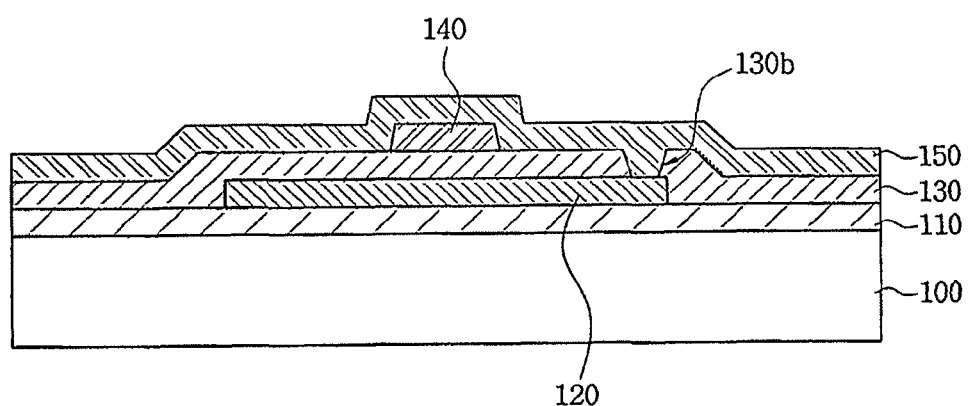

Referring to FIG. 1C, an electrical field may be applied to the metal layer 140' to generate an electric current therethrough, which may generate heat due to Joule heating. The heat generated from the metal layer 140' may be transferred to the amorphous semiconductor pattern 120' to induce crystallization thereof. During crystallization, the amorphous semiconductor pattern 120' may be crystallized into a crystalline semiconductor pattern 120. The crystalline semiconductor pattern 120 may be, e.g., polycrystalline silicon.

Here, for preferable crystallization, a voltage of about 100 V/cm$^2$ to about 10,000 V/cm$^2$ may be applied to the metal layer 140' for about 1 μs to 1 sec. An electrical field of less than about 100 V/cm$^2$ may not generate sufficient Joule heat for crystallization, while an electrical field of more than about 10,000 V/cm$^2$ may generate a local arc. Moreover, when an electrical field is applied for less than about 1 μs, crystallization may not be facilitated due to insufficient Joule heat, and when an electrical field is applied for more than about 1 sec, the substrate may be bent or, may form a defect along the edge as heat transfers during crystallization.

In addition, the metal layer 140' may be in direct contact with the amorphous semiconductor pattern 120' through the semiconductor pattern access hole 130*b* and, thus, may prevent occurrence of an arc resulting from heat transfer during the crystallization and may reduce defects.

After the crystalline semiconductor pattern 120 is formed of, e.g., polycrystalline silicon, the metal layer 140' may be etched and partially removed, thereby forming a gate electrode 140 disposed on the gate insulating layer to correspond to a channel region 120*c* of the crystalline semiconductor pattern 120.

Then, an interlayer insulating layer 150 may be formed on the entire surface of the substrate 100 including the gate electrode 140. The interlayer insulating layer 150 may be, e.g., a silicon nitride layer, a silicon oxide layer, or a combination thereof.

Figure 1D:
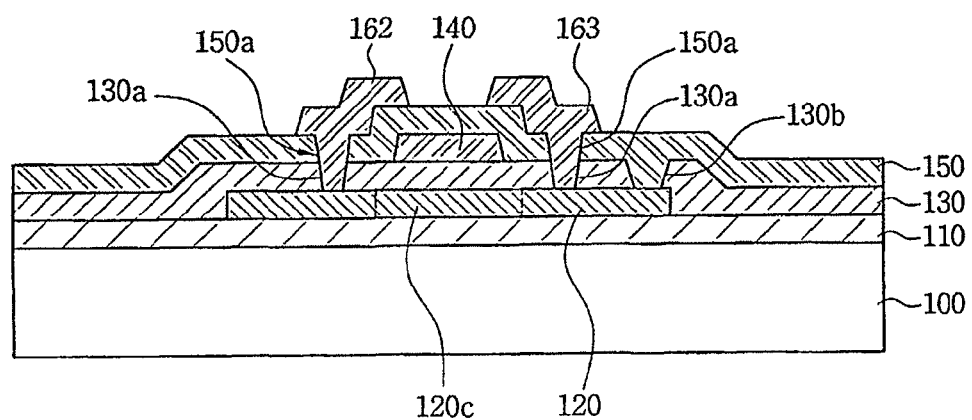

Referring to FIG. 1D, after forming the interlayer insulating layer 150, the gate insulating layer 130 and the interlayer insulating layer 150 may be etched, thereby forming one or more first source/drain contact holes 130*a* in the gate insulating layer 130*a*, and forming one or more second source/drain contact holes 150*a* in the interlayer insulating layer 150*a*, in order to partially expose the crystalline semiconductor pattern 120.

Source and drain electrodes 162 and 163 may be connected to the crystalline semiconductor pattern 120 through the first and second source/drain contact holes 130*a*, 150*a*. The source and drain electrodes 162 and 163 may be formed of one or more of molybdenum (Mo), chromium (Cr), tungsten (W), MoW, aluminum (Al), Al—Nd, titanium (Ti), titanium nitride (TiN), copper (Cu), a Mo alloy, an Al alloy, and a Cu alloy. Accordingly, the TFT according to the first example embodiment may be completed.

Figure 2:
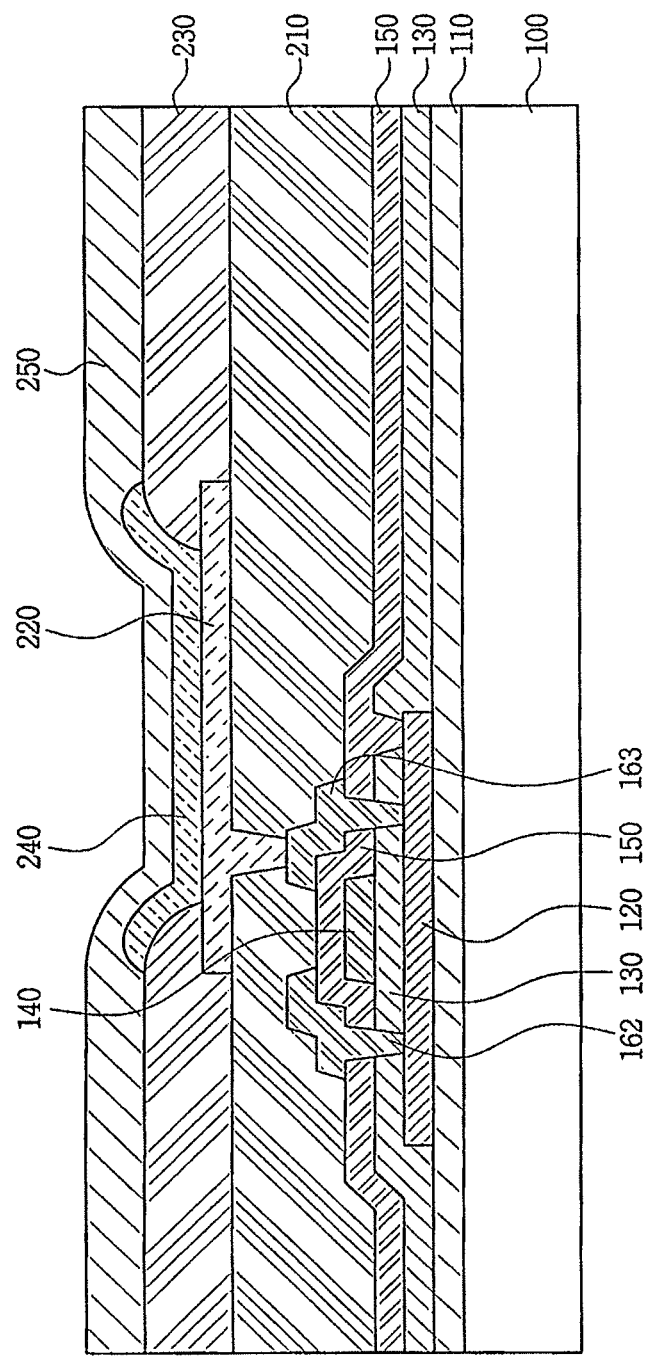
FIG. 2 illustrates a cross-sectional view of an OLED display device according to a second example embodiment.

FIG. 2 illustrates a cross-sectional view of an OLED display device according to a second embodiment.

Referring to FIG. 2, a passivation layer 210 may be formed on the entire surface of the substrate 100 including the TFT formed according to the first example embodiment described in FIG. 1D. The passivation layer 210 may be formed of an inorganic material, e.g., silicon oxide, silicon nitride, and silicate on glass, an organic material, e.g., polyimide, benzocyclobutene series resin, and acrylate, or a combination thereof.

The passivation layer 210 may be etched to form a via hole exposing the source electrode 162 or the drain electrode 163. A first electrode 220 may be formed on the passivation layer 210, and may be connected to either the source electrode 162 or the drain electrode 163 through the via hole. The first electrode 220 may be an anode or a cathode. When the first electrode 220 is an anode, it may be formed of a transparent conductive layer, e.g., an ITO, IZO, or ITZO layer. When the first electrode 220 is a cathode, it may be formed of magnesium (Mg), calcium (Ca), aluminum (Al), silver (Ag), barium (Ba), or an alloy thereof.

Subsequently, a pixel defining layer 230 may be formed on the passivation layer 210 and on the first electrode 220. The pixel defining layer may include an opening partially exposing a surface of the first electrode 220, and an organic layer 240 including an emission layer, which may be formed on the exposed first electrode 220. The organic layer 240 may further include at least one or more of a hole injection layer, a hole transport layer, a hole blocking layer, an electron blocking layer, an electrode injection layer, and an electron transport layer. Then, a second electrode 250 may be formed on the organic layer 240. Accordingly, the OLED display device according to the second example embodiment may be completed.

Using a rapid annealing method that applies an electrical field to a conductive layer and generates Joule heat, it may be possible to rapidly anneal a selected material by transferring high heat. This is desirable, as the rapid annealing method may have a much higher heating rate than that of the conventional RTA method. However, such a rapid annealing method may introduce physical defects to the substrate from an arc generated during the Joule heating. Thus, according to embodiments, an electrode may be formed on the amorphous semiconductor layer before crystallization, such that occurrence of an arc caused by Joule heat during the crystallization operation may be prevented. Thus, defects may be reduced, and production yield may be improved.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a thin film transistor, the method comprising:

forming a buffer layer on a substrate;

forming an amorphous semiconductor layer on the buffer layer;

patterning the amorphous semiconductor layer to form an amorphous semiconductor pattern;

forming a gate insulating layer on the amorphous semiconductor pattern;

forming a semiconductor pattern access hole in the gate insulating layer;

forming a metal layer on the substrate, the metal layer covering the gate insulating layer, and being in the semiconductor pattern access hole so as to be in contact therethrough with the amorphous semiconductor pattern;

passing an electric current through the metal layer so as to convert the amorphous semiconductor pattern to a crystallized semiconductor pattern using heat generated by the electric current;

patterning the metal layer to form a gate electrode corresponding to the crystallized semiconductor pattern;

forming an interlayer insulating layer on the gate electrode;

forming two first source/drain contact holes in the gate insulating layer and two source/drain contact holes in the interlayer insulating layer; and forming source and drain electrodes connected to the semiconductor layer through the first and second source/drain contact holes.

2. The method as claimed in claim 1, wherein the crystallization is performed while the metal layer is in contact with the amorphous semiconductor pattern through the semiconductor pattern access hole.

3. The method as claimed in claim 1, wherein the electric current is generated by applying an electrical field of about 100 V/cm$^2$ to about 10,000 V/cm$^2$ to the metal layer.

4. The method as claimed in claim 1, wherein the gate electrode is formed to a thickness of about 50 nm to about 200 nm.

5. The method as claimed in claim 1, wherein the semiconductor pattern access hole is spaced apart from the first source/drain contact holes.

6. The method as claimed in claim 1, wherein the semiconductor pattern access hole is formed to correspond to a region other than a channel region of the crystallized semiconductor pattern.

7. The method as claimed in claim 1, wherein the semiconductor pattern access hole partially exposes the crystalline semiconductor pattern and the exposed crystalline semiconductor pattern is in contact with the interlayer insulating layer through the semiconductor pattern access hole.

8. The method as claimed in claim 1, wherein:
the semiconductor pattern access hole is spaced apart from the first source/drain contact holes,
the semiconductor pattern access hole is at an upper region of the semiconductor pattern, and
the semiconductor pattern access hole corresponds to a region other than a channel region of the semiconductor pattern.

9. The method as claimed in claim 1, wherein the gate electrode is formed of aluminum, chromium, molybdenum, or a combination thereof.

10. The method as claimed in claim 1, wherein the gate insulating layer includes two or more semiconductor pattern access holes therein.

11. A method of fabricating a thin film transistor, the method comprising:
forming a buffer layer on a substrate;
forming a crystalline semiconductor pattern on the buffer layer;
forming a gate insulating layer on the crystalline semiconductor pattern, the gate insulating layer having two first source/drain contact holes and a semiconductor pattern access hole therein, the semiconductor pattern access hole partially exposing the crystalline semiconductor pattern;
forming a gate electrode on the gate insulating layer, the gate electrode being between the two first source/drain contact holes;
forming an interlayer insulating layer covering the gate electrode, the interlayer insulating layer having two second source/drain contact holes therein, the exposed crystalline semiconductor pattern being in contact with the interlayer insulating layer through the semiconductor pattern access hole; and
forming source and drain electrodes on the interlayer insulating layer, each of the source and drain electrodes being insulated from the gate electrode, and having a portion connected to the crystalline semiconductor pattern through the first and second source/drain contact hole.

12. The method as claimed in claim 11, wherein the crystallization is performed while the metal layer is in contact with the amorphous semiconductor pattern through the semiconductor pattern access hole.

13. The method as claimed in claim 11, wherein the electric current is generated by applying an electrical field of about 100 V/cm$^2$ to about 10,000 V/cm$^2$ to the metal layer.

14. The method as claimed in claim 11, wherein the gate electrode is formed to a thickness of about 50 nm to about 200 nm.

15. The method as claimed in claim 11, wherein the semiconductor pattern access hole is spaced apart from the first source/drain contact holes.

16. The method as claimed in claim 11, wherein the semiconductor pattern access hole is formed to correspond to a region other than a channel region of the crystallized semiconductor pattern.

17. The method as claimed in claim 11, wherein:
the semiconductor pattern access hole is spaced apart from the first source/drain contact holes,
the semiconductor pattern access hole is at an upper region of the semiconductor pattern, and
the semiconductor pattern access hole corresponds to a region other than a channel region of the semiconductor pattern.

18. The method as claimed in claim 11, wherein the gate electrode is formed of aluminum, chromium, molybdenum, or a combination thereof.

19. The method as claimed in claim 11, wherein the gate insulating layer includes two or more semiconductor pattern access holes therein.

* * * * *